United States Patent [19]
Chu

[11] Patent Number: 5,519,239
[45] Date of Patent: May 21, 1996

[54] STRUCTURE AND METHOD FOR IMPROVED MEMORY ARRAYS AND IMPROVED ELECTRICAL CONTACTS IN SEMICONDUCTOR DEVICES

[75] Inventor: Sam Chu, San Jose, Calif.

[73] Assignee: Catalyst Semiconductor Corp., Santa Clara County, Calif.

[21] Appl. No.: 336,886

[22] Filed: Nov. 10, 1994

Related U.S. Application Data

[63] Continuation of Ser. No. 968,721, Oct. 30, 1992, abandoned.

[51] Int. Cl.$^6$ .................................................. H01L 29/76
[52] U.S. Cl. ............... 257/314; 257/336; 257/390; 257/401; 257/752; 257/763; 257/770; 257/774; 257/905
[58] Field of Search ............................. 257/758, 774, 257/323, 314, 336, 390, 401, 752, 763, 770, 774, 905

[56] References Cited

U.S. PATENT DOCUMENTS

| | | | |
|---|---|---|---|
| 4,707,457 | 11/1987 | Erb . | |
| 5,091,768 | 2/1992 | Yamazaki | 257/758 |
| 5,233,210 | 8/1993 | Kodama | 257/323 |
| 5,340,760 | 8/1994 | Komori et al. . | |

Primary Examiner—Edward Wojciechowicz
Attorney, Agent, or Firm—Skjerven, Morrill, MacPherson Franklin & Friel; David W. Heid; David T. Millers

[57] ABSTRACT

A structure and method are provided which reduce memory cell size by forming self-formed contacts and self-aligned source lines in the array. In one embodiment of the present invention, a plurality of memory cells are formed in an array. Then, a first insulating layer is deposited on the array, and subsequently etched to form spacers on the sidewalls of each memory cell. Conductive plugs are then formed between adjacent spacers. Subsequently, a second insulating layer is deposited over the array. Finally, drain contacts are formed through the second insulating layer to a first set of plugs. Other plugs form source lines for the array. Because the present invention provides a self-formed contact, only the second insulating layer is etched to establish contact between a metal bit line and an underlying diffused drain region. Thus, the present invention ensures appropriate isolation for each memory cell while reducing the area required for contact formation. In this manner, the self-formed contact allows for significant size reduction of the contact pitch. Moreover, using other plugs to form the self-aligned source lines of the array further reduces the size of the word line pitch, thereby dramatically reducing the associated cell size and allowing formation of ultra-high density memory arrays.

18 Claims, 14 Drawing Sheets

STRUCTURE AND METHOD FOR IMPROVED MEMORY ARRAYS AND IMPROVED ELECTRICAL CONTACTS IN SEMICONDUCTOR DEVICES

This application is a continuation of application Ser. No. 07/968,721, filed Oct. 30, 1992 now abandoned.

BACKGROUND OF THE INVENTION

Field of the Invention

This invention relates to memory arrays and, in particular to formation of self-formed contacts and self-aligned source lines in memory arrays.

Description of Related Art

Arrays comprising memory cells are well known in the art. Illustrative memory cells include electrically-programmable read only memories (EPROMs), flash EPROMs, electrically-erasable programmable read only memories (EEPROMs), and dynamic random access memories (DRAMs). In general, the smaller the memory cell size the smaller the integrated circuit die or chip containing a given number of memory cells, and therefore the higher the yield of useful semiconductor dice in the manufacturing process. Moreover, because a smaller memory cell size results in a smaller integrated circuit die for a given size memory cell array, more semiconductor dice can be obtained from a given size wafer, thereby lowering the manufacturing cost per die. As shown in FIG. 1, EPROM density, for example, doubles on the average every 1.8 years. The density of flash EPROMS doubles at even a faster rate. However, the size of the associated EPROM cells (in area dimensions) has not decreased at the same rate and, in fact, has halved approximately every 3.5 years, as illustrated graphically by curve 200 in FIG. 2. Thus, die size is dramatically increasing. The actual memory cell size (curve 200) remains larger than the theoretical minimum cell size (curve 201) because of non-self-aligned design rules currently limiting size reduction of the cell. Therefore, a need arises to reduce memory cell size to more nearly approximate the minimum theoretical cell size (i.e., lithographic limit), thereby reducing die size.

SUMMARY OF THE INVENTION

In accordance with the present invention, a structure and method are provided which reduce memory cell size by forming a self-formed contact in a memory cell array.

Conventional preparation of a substrate is followed by forming a plurality of memory cells in a memory cell array, depositing a first insulating layer on the memory cell array, and subsequently etching this first insulating layer to form tapered sidewall spacers along edges of the gates of the memory cells. In one embodiment, a conductive plug is then formed between adjacent tapered sidewall spacers to provide electrical connection to a region in the substrate. A second insulating layer is deposited over the memory cell array. Finally, a conductive contact to the plug is formed through the second insulating layer with the plug.

The self-formed contact in accordance with the present invention ensures appropriate isolation for each memory cell irrespective of possible contact misalignment. Specifically, the present invention provides a self-formed contact which requires a final etching only through the second insulating layer. In this manner, misalignment of the contact opening will never result in breach of the memory cell isolation. Thus, memory cell isolation is ensured while also reducing the space conventionally required for contact formation. In this manner, the self-formed contact allows for significant size reduction of a memory cell, thereby dramatically reducing the associated die size and allowing formation of ultra-high density memory arrays.

In accordance with another aspect of the present invention, a plurality of conductive plugs are formed between adjacent spacers. The conductive contact is formed through the second insulating layer to one of these conductive plugs. Another of these conductive plugs provides a self-aligned source line for the memory array. This self-aligned source line significantly reduces source line resistance compared to conventional diffused source lines, thereby reducing the need for source line contacts. Fewer source line contacts reduces the number of process steps for array fabrication, thereby reducing manufacturing cost and increasing array reliability.

This invention will be more fully understood in light of the following detailed description taken together with the attached drawings.

DETAILED DESCRIPTION OF THE DRAWINGS

Figure 1:
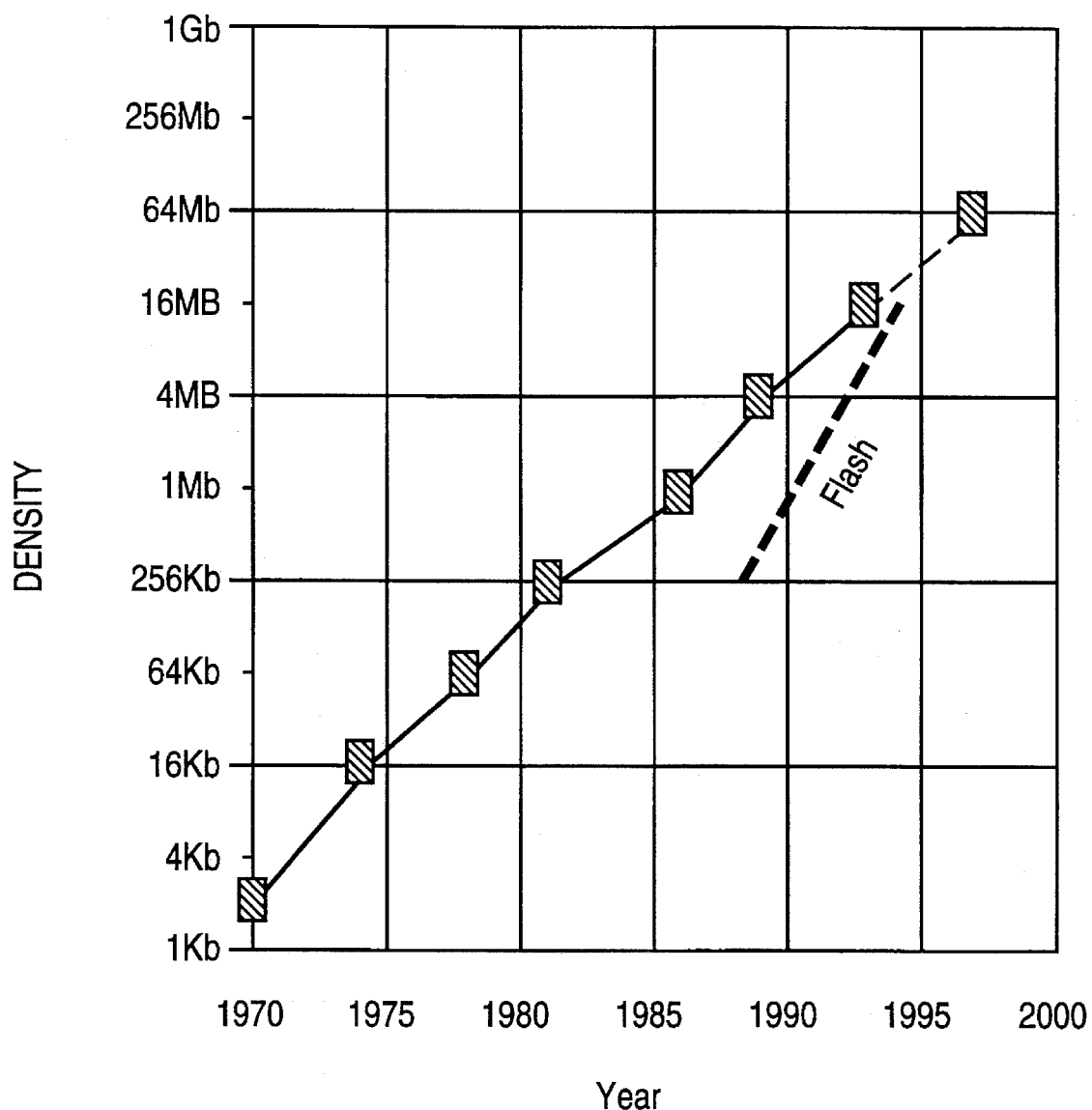
FIG. 1 graphically illustrates the density of typical EPROMS versus time.
Figure 2:
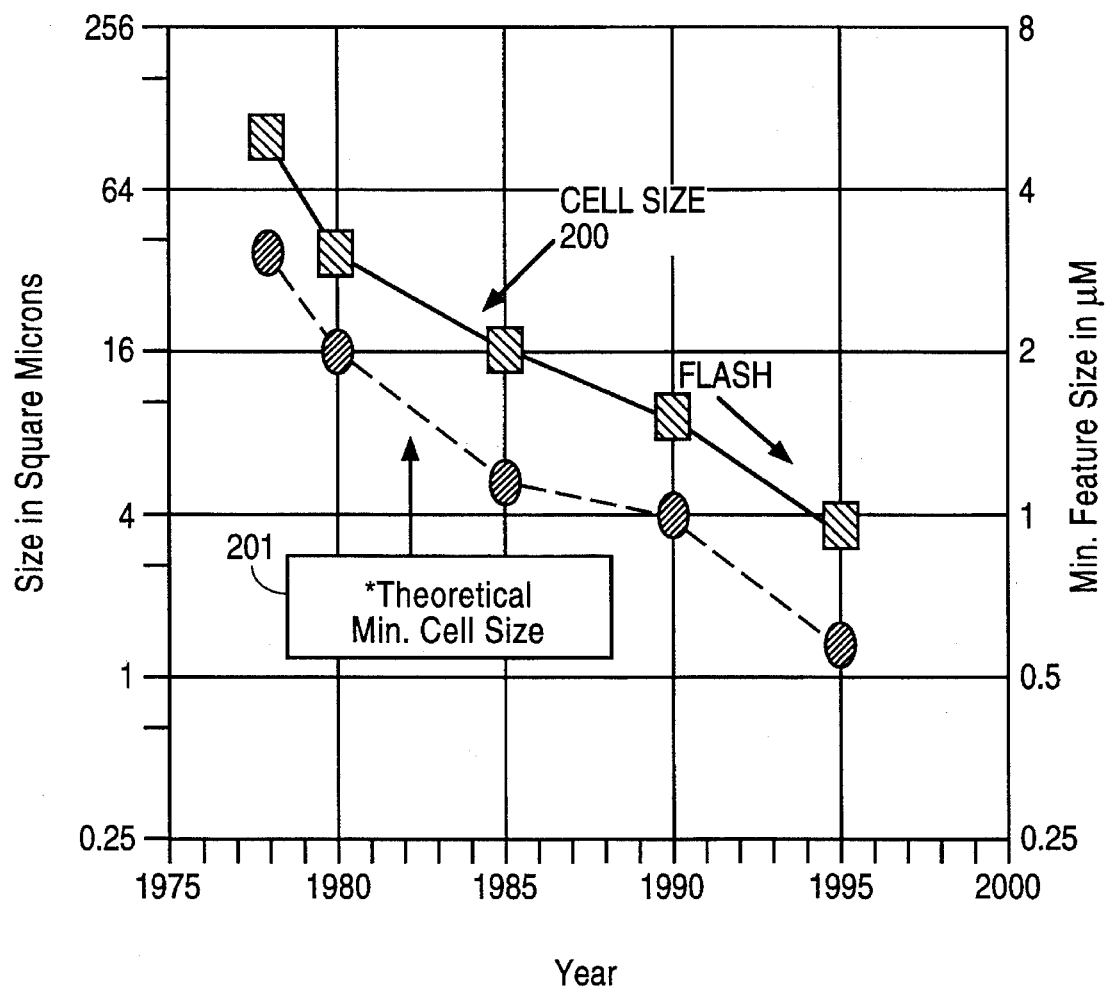
FIG. 2 graphically illustrates typical EPROM cell size versus time.
Figure 3A:
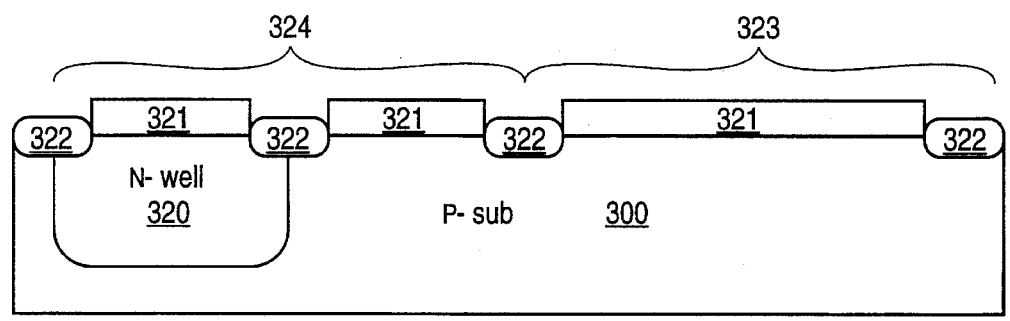
FIGS. 3A–3G illustrate conventional prior art steps for preparing the substrate, and forming the memory cells in the array and the transistors used in the periphery of the array.

In one embodiment of the present invention, the self-formed contacts in the memory array are formed in the following manner. Referring to FIG. 3A, a silicon substrate 300 with a crystal orientation of (100) is doped with a conventional P-type dopant, such as boron, to approximately a resistivity of 3.5 Ohm-cm. Through standard CMOS processing steps, substrate 300 is selectively masked and then doped with an N-type dopant, such as phosphorous, to create an N-type well 320. Well 320 typically has a doping concentration of approximately $2 \times 10^{16}/cm^3$. A subsequent annealing step is performed with nitrogen at about 1150° C. for approximately 200 minutes drives in well 320.

Figure 3B:
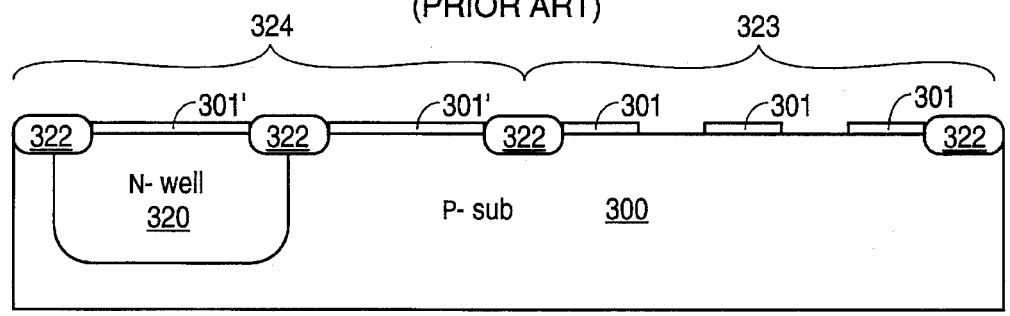

After formation of well 320, a layer of nitride is formed on substrate 300, and etched to form patterned nitride strips 321. Field oxide 322, having a thickness typically of 5000Å, is then formed on substrate 300 between nitride strips 321 by conventional local oxidation of silicon (LOCOS). Field oxide 322 isolates the to-be-formed transistors in periphery 324 and the to-be-formed cells in the memory array 323. Nitride strips 321 are then removed. Following this removal, a layer of insulation (not shown) is formed for tunnel oxide, then a layer of polysilicon 301' is deposited on array 323 and periphery 324 to a thickness of approximately 1000Å and patterned to define the floating gates 301 for the to-be-formed memory cells in array 323 as shown in FIG. 3B.

Figure 3C:
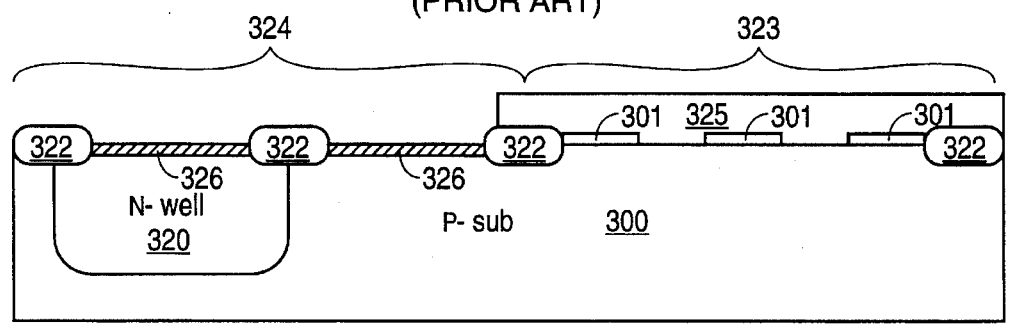

Subsequent to patterning of polysilicon 301', three thin insulation layers (not shown) are deposited. Typically these layers include an oxide layer of about 125Å thick, a nitride layer of about 100Å, and a final layer of oxide of about 30Å thick (the combination of layers commonly referred to as ONO). A photoresist mask 325 is then formed over array 323. A subsequent conventional etch removes the ONO layer (not shown) and polysilicon layer 301' from periphery 324. Then, conventional methods are used to implant substrate 300 in periphery 324 to adjust the threshold voltage for the P-type and N-type transistors. Portions of these implant regions 326, shown in FIG. 3C, will later form the channel regions in the P-type and N-type transistors.

Figure 3D:
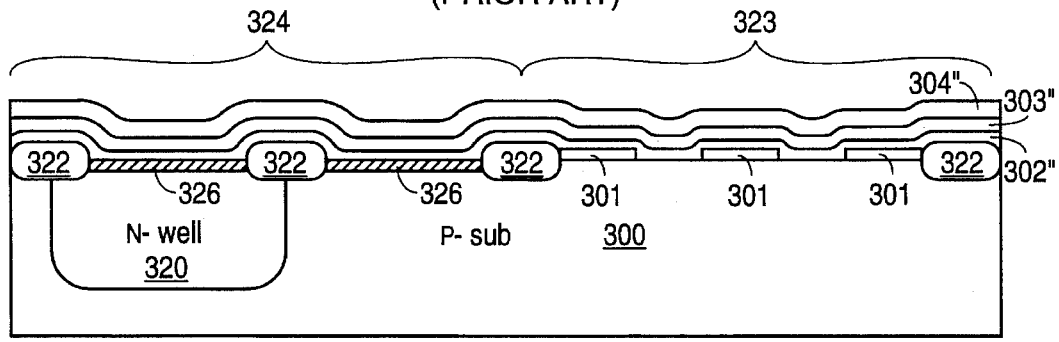

Referring to FIG. 3D and following removal of photoresist mask 325, a layer 302" of polysilicon is deposited over array 323 and periphery 324 to a thickness of approximately 1000Å. Then a layer 303" of refractory metal silicide, for example tungsten silicide, is sputtered on polysilicon layer 302" to a thickness of about 1500Å. Finally, an insulating layer 304" of, for example, tetraethoxysilane (TEOS) or phosphosilicate glass (PSG) is deposited on layer 303" to a thickness of approximately 3000Å.

Figure 3E:
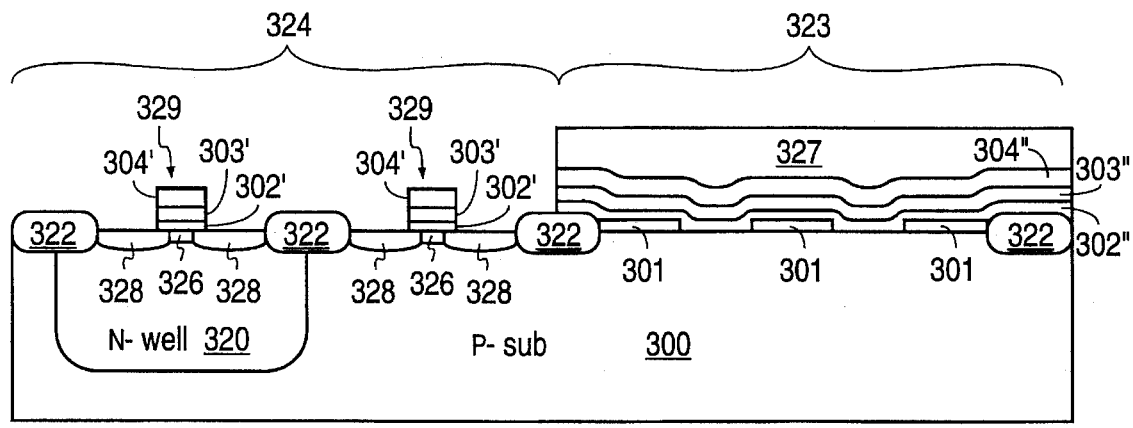

To form the transistors in periphery 324, a photoresist mask 327 is formed on insulating layer 304" and then patterned to protect array 323 as shown in FIG. 3E. An anisotropic etch is then performed in periphery 324 through insulating layer 304", refractory metal silicide layer 303" and polysilicon layer 302" to define the transistors 329 (P-type and N-type) in periphery 324. Specifically, transistors 329 include polysilicon gates 302', refractory metal silicide layers 303' and insulating layers 304'. Conventional self-aligned methods are then used to form implant regions 328 in substrate 300 to provide the source/drain regions for transistors 329. Photoresist mask 327 is then removed.

Figure 3F:
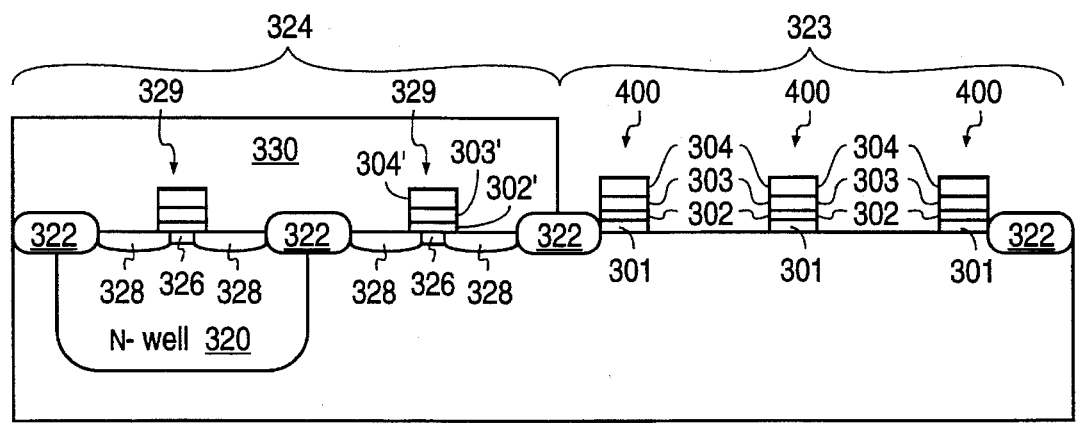

To form the memory cells of array 323, a photoresist layer 330 is formed and patterned to protect periphery 324 as shown in FIG. 3F. An anisotropic etchant, etching through insulating layer 304", refractory metal layer 303", and polysilicon layer 302" in array 323 defines a self-aligned control gate 302 and a floating gate 301 for each memory cell 400. Insulating layers 304 serve as insulation for the upper surface of memory cells 400. Photoresist layer 330 is then removed.

Figure 3G:
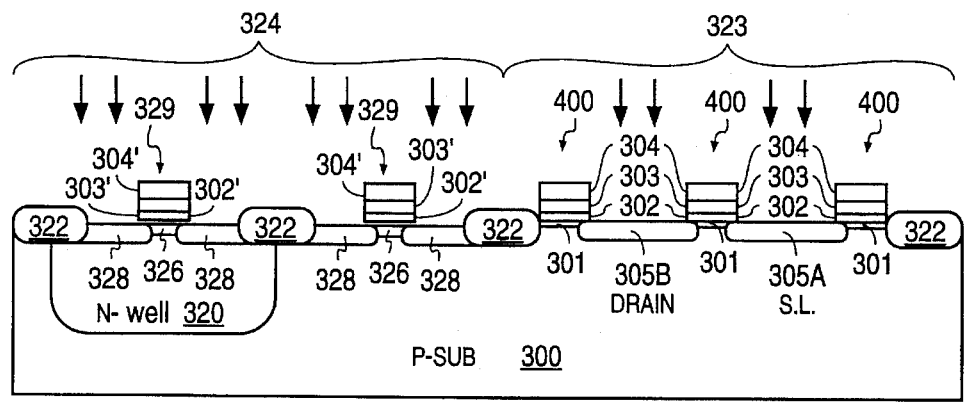

Conventional implantation methods are then used to form source and drain regions 305A and 305B, respectively, for memory cells 400 in array 323 as shown in FIG. 3G. Following the formation of source/drain regions 305, thin oxide layers 306 of typically 200Å wide are formed on the sidewalls of memory cells 400 and transistors 329 in a reoxidation step to provide further isolation. Re-oxidation is well known in the art, and therefore is not described in detail.

Figure 3H:
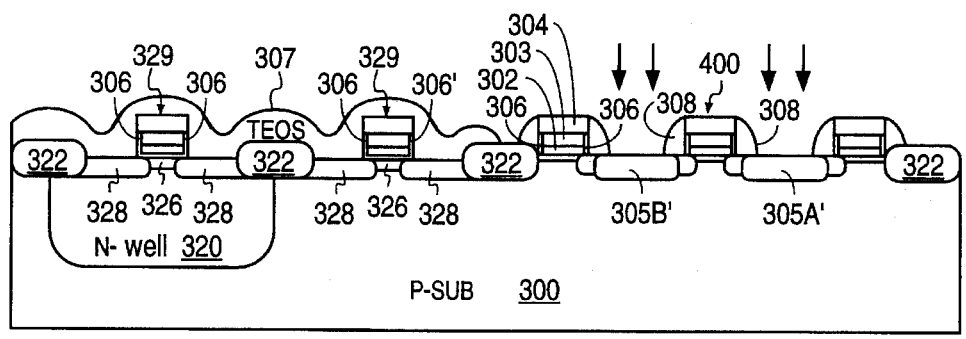
FIGS. 3H–3O show the process steps used in one embodiment of the present invention to form the self-formed contacts and self-aligned source lines in the array, followed by formation of the contacts in the periphery.

After reoxidation, an isolating layer 307 of, for example, TEOS or PSG is deposited over array 323 and periphery 324. A photoresist mask (not shown) is then formed over periphery 324. Insulating layer 307 in array 323 is then anisotropically etched, for example by reactive ion etching (RIE), to form cell sidewall spacers 308 on the sidewalls of memory cells 400 (adjacent oxide layers 306), as shown in FIG. 3H. In one embodiment, after formation of cell sidewall spacers 308, source and drain regions 305A and 305B, respectively, are implanted with an N++ implant, such as phosphorus, to create implant regions 305A' and 305B'. These implant regions provide a better contact between the to-be-formed plugs and source/drain regions 305.

Figure 3I:
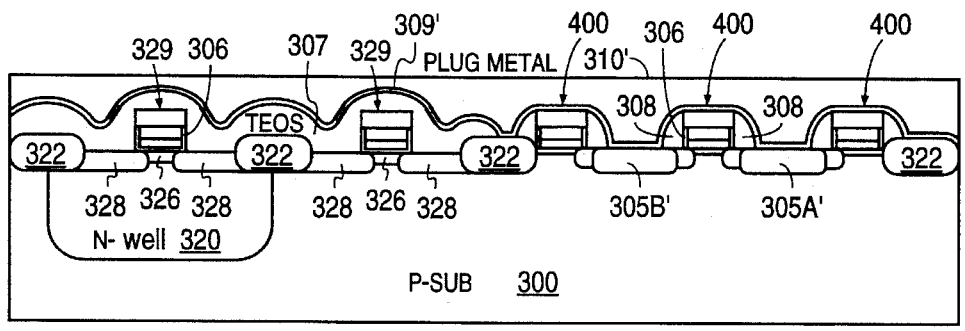
Figure 3J:
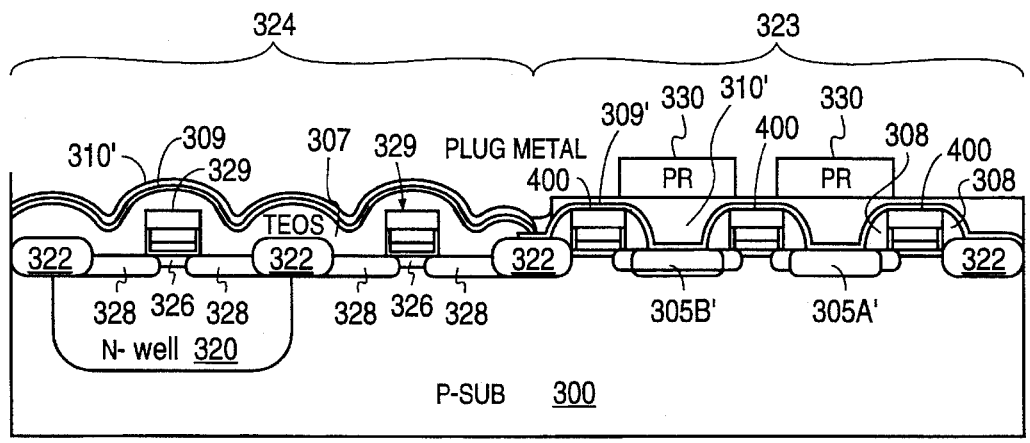
Figure 3K:
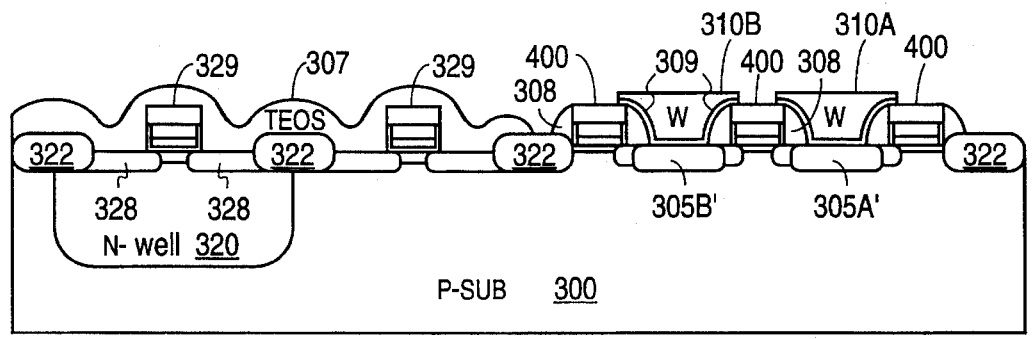

Subsequent to the N++ implant and referring to FIG. 3I, a glue/barrier layer 309' of titanium nitride (TIN) is deposited to a thickness of about 1000Å, followed by deposition of a refractory metal layer 310', such as tungsten, to a thickness of about 5000Å to fill the gaps between cells 400. Then, in one embodiment, approximately 70±20% of refractory metal layer 310' is partially etched back as shown in FIG. 3J to form a layer having a planar surface and providing a thickness of approximately 1000Å on top of cells 400. Following this etching, a layer of photoresist is deposited and patterned to form masks 330. A subsequent anisotropic etch through refractory metal layer 310' and titanium nitride layer 309' forms plugs 310A and 310B in array 323 and removes titanium nitride layer 309' and refractory metal layer 310' in periphery 324 as shown in FIG. 3K. Plug 310B forms the metal drain pad for the to-be-formed bit line contact, while plug 310A forms a metal source line (explained in detail below).

Figure 3L:
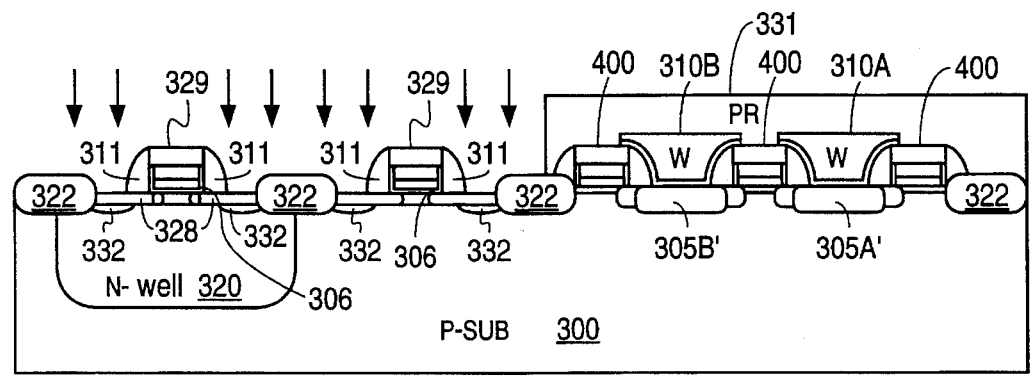

A photoresist layer 331, shown in FIG. 3L, is then formed and patterned to expose only periphery 324. A subsequent anisotropic etch, for example a reactive ion etch, of insulating layer 307 to implant regions 328 forms sidewall spacers 311 on the sidewalls of transistors 329 (adjacent to oxide layers 306). Then source/drain regions 332 are formed in periphery 324 by conventional N+/P+ implantation methods. Finally, photoresist layer 331 is removed.

Figure 3M:
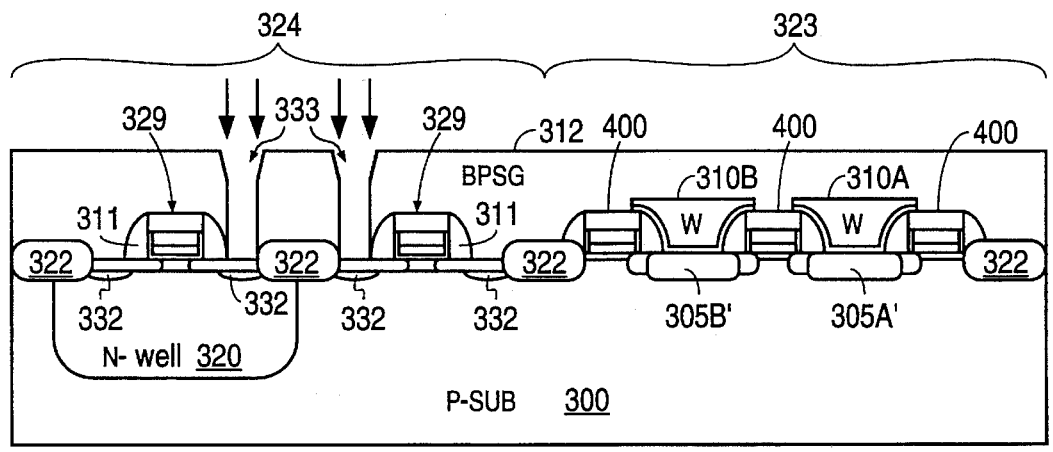
Figure 3N:
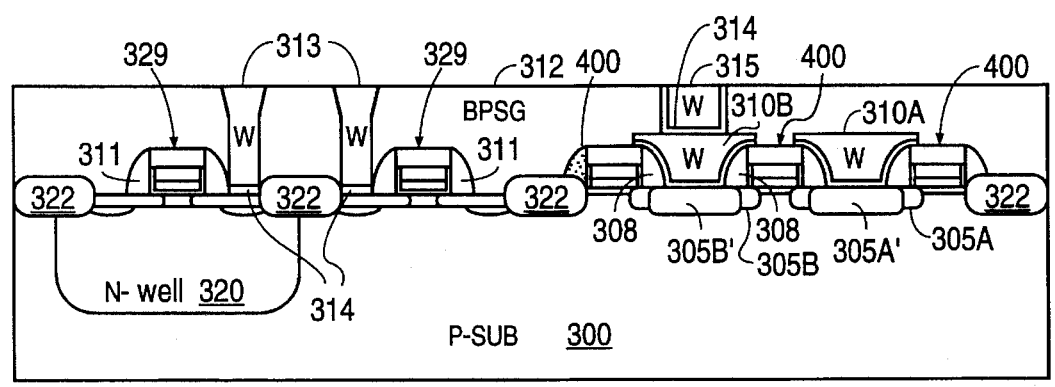

In accordance with the present invention, another insulating layer 312 of, for example, BPSG is deposited over array 323 and periphery 324. A photoresist layer (not shown) is formed on insulating layer 312 and then patterned such that a subsequent conventional contact hole etch through insulating layer 312 to selected source/drain regions 332 forms openings 333 as shown in FIG. 3M. Contact implants (not shown) using phosphorus (N+ contacts) or BF$_2$ (P+ contacts) are formed in drain/source regions 332 through openings 333. Then the photoresist layer (not shown) is further patterned such that a subsequent selective etch through insulating layer 312 forms an opening to plug 310A which is overlying drain region 305B. In one embodiment of the present invention, a barrier metal layer 314, such as titanium or titanium nitride, is deposited over the exposed portion of plug 310B. Then, a conductive layer, such as tungsten, is deposited over array 323 and periphery 324 and etched back to form plugs 313 and 315 as shown in FIG. 3N. Note that plugs 313 and 315 are typically formed from the same material as plugs 310A and 310B.

Following the formation of plugs 313 and 315, a metal layer is formed over insulating layer 312 and the top surface of plugs 313, 315. Then, a photoresist mask (not shown) is formed and patterned to form metal lines 316 (the bit line) and 317.

In another embodiment of the present invention, illustrated in FIGS. 3P–3V, the self-formed contacts in array 323 are formed simultaneously with the contacts in periphery 324. In this embodiment, the initial steps to prepare substrate 300 and to define transistors 329 in the periphery and memory cells 400 in the array are identical to the above-described steps 3A–3G. Then, referring to FIG. 3P, a conventional mask oxidation at 900° C. in an oxygen/nitrogen environment forms oxide layers 306 (approximately 200Å wide) on the sidewalls of transistors 329 and memory cells 400. Subsequently, an insulating layer of TEOS is deposited to a thickness of approximately 3000Å over array 323 and periphery 324, and then anisotropically etched to form sidewall spacers 311 on the sidewalls of transistors 329 and sidewall spacers 308 on the sidewalls of memory cells 400.

After formation of sidewall spacers 308 and 311, a second reoxidation forms oxide layers 336 in array 323 and periphery 324 to a thickness of about 200Å. Oxide layers 336 provide additional protection for substrate 300 during subsequent implanting steps. A photoresist mask (not shown) is then placed over array 323 while source/drain regions 332 are formed using conventional methods for transistors 329. The removal of this photoresist mask is followed by placement of another photoresist mask (also not shown) over periphery 324 while contact regions 305A' and 305B' are formed for memory cells 400. Then, this photoresist mask is also removed.

Figure 3O:
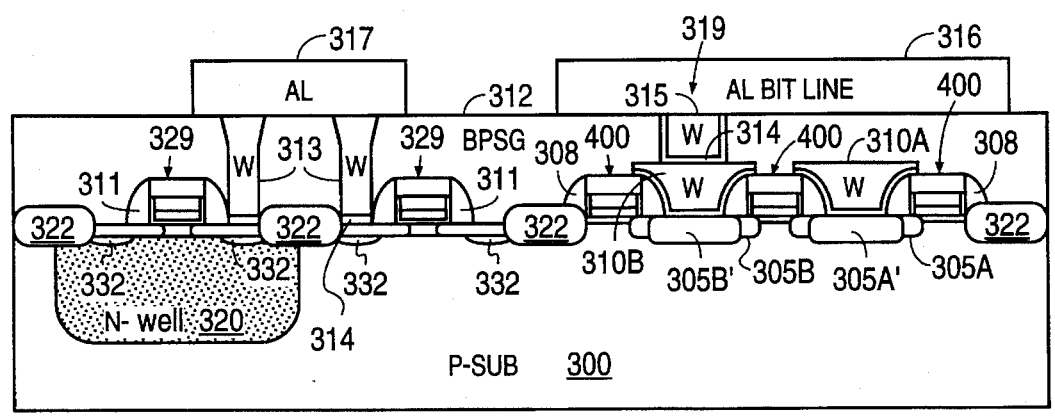
Figure 3P:
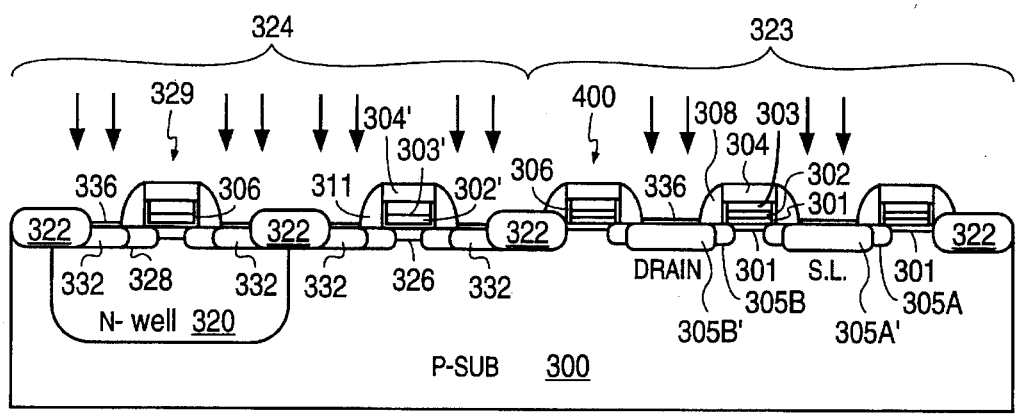
FIGS. 3P–3V illustrate the process steps used in another embodiment of the present invention to simultaneously form the self-formed contacts and the self-aligned source line in the array and the contacts in the periphery.
Figure 3Q:
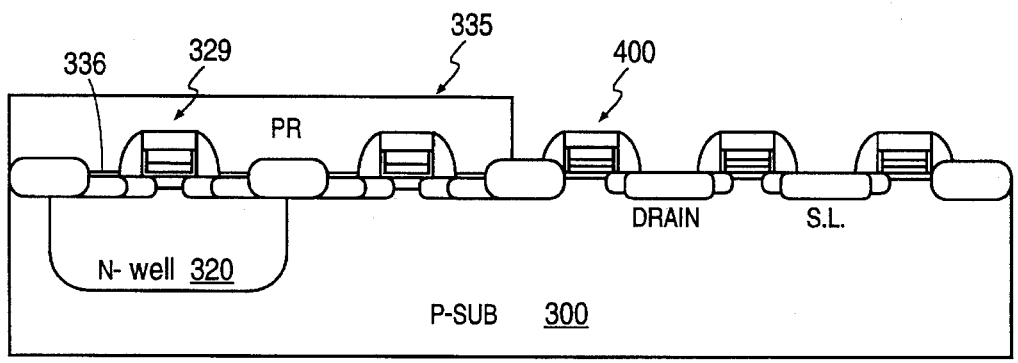
Figure 3R:
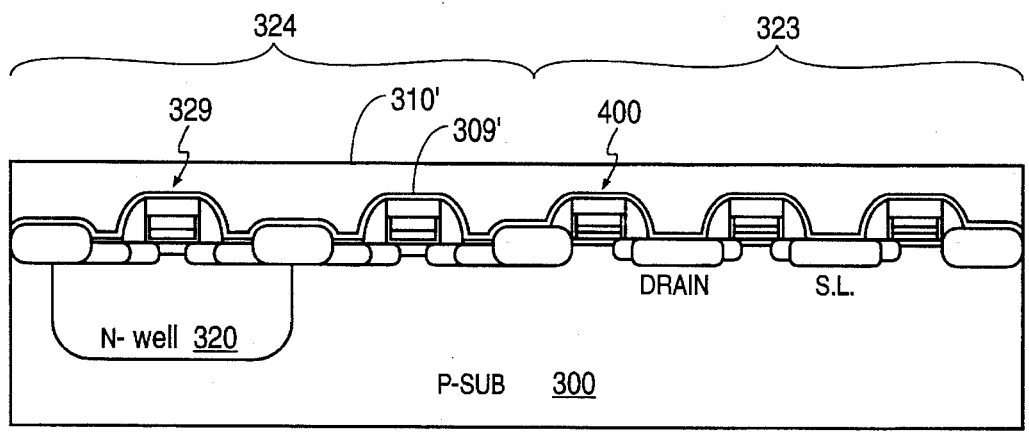

After placing a photoresist mask 335 over periphery 324, oxide layers 336 are removed in array 323, as shown in FIG. 3Q. Photoresist mask 335 is then removed. Referring to FIG. 3R, a barrier metal layer 309' such as titanium nitride (TiN), is deposited over array 323 and periphery 324 to a thickness of about 1000Å, followed by deposition of a refractory metal layer 310' such as tungsten, to a thickness of about 5000Å.

Figure 3S:
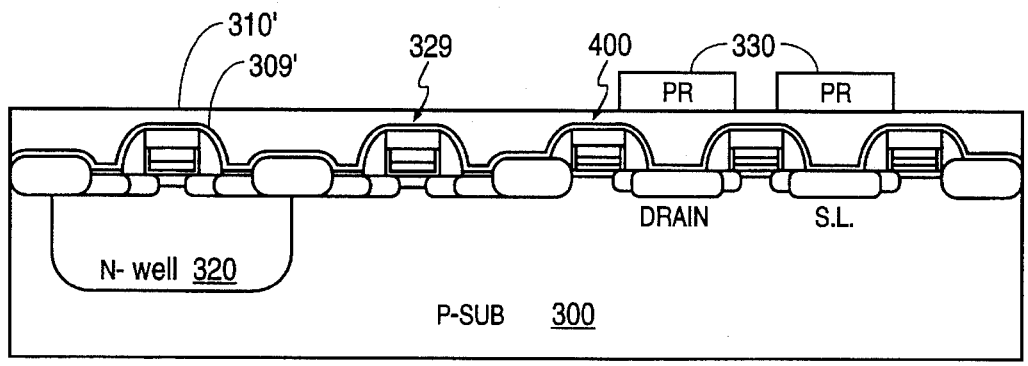
Figure 3T:
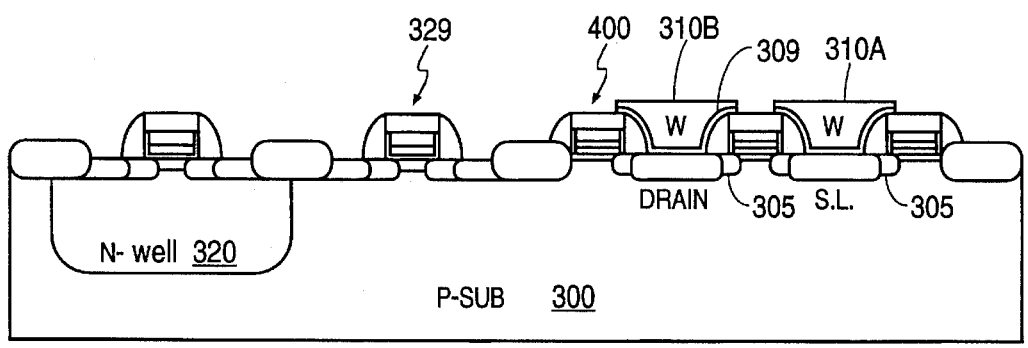

Then, approximately 70±20% of refractory metal layer 310' is etched back as shown in FIG. 3S. Following this etching, a layer of photoresist is deposited and patterned to form masks 330 which protect source/drain regions 305 in array 323. A subsequent anisotropic etch through refractory metal layer 310' and barrier metal layer 309' forms plugs 310A and 310B in array 323 and removes portions of titanium nitride layer 309' and refractory metal layer 310' in array 323 and periphery 324 not protected by masks 330 as shown in FIG. 3T. As noted previously, plug 310B forms the metal drain pad for the to-be-formed bit line contact while plug 310A forms a metal source line for array 323.

Figure 3U:
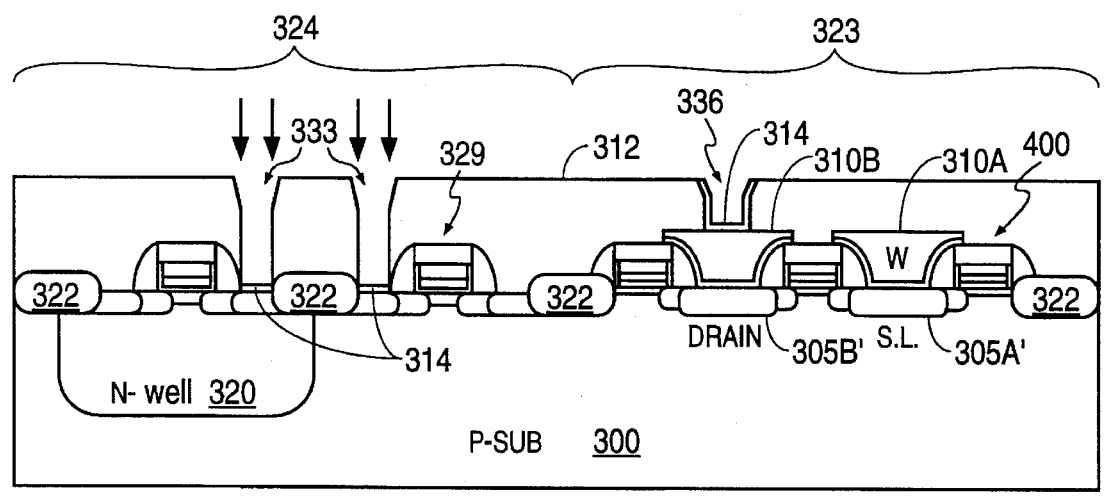

Following the formation of plugs 310 in array 323 and removal of masks 330 of, for example BPSG, is deposited over array 323 and periphery 324. A photoresist layer (not shown) is formed on insulating layer 312 and then patterned such that a subsequent, selective conventional contact hole etch of insulating layers 312 to oxide layer 336 (in periphery 324) and to plug 310B (in array 323) as shown in FIG. 3U forms openings 333 in periphery 324 and opening 336 in array 323.

Contact implants (not shown) are then conventionally performed in periphery 324. In one embodiment of the present invention, a barrier metal layer 314, approximated 1000Å, is deposited over the exposed portions of plug 310A (in array 323) and source/drain regions 332 (in periphery 324).

Figure 3V:
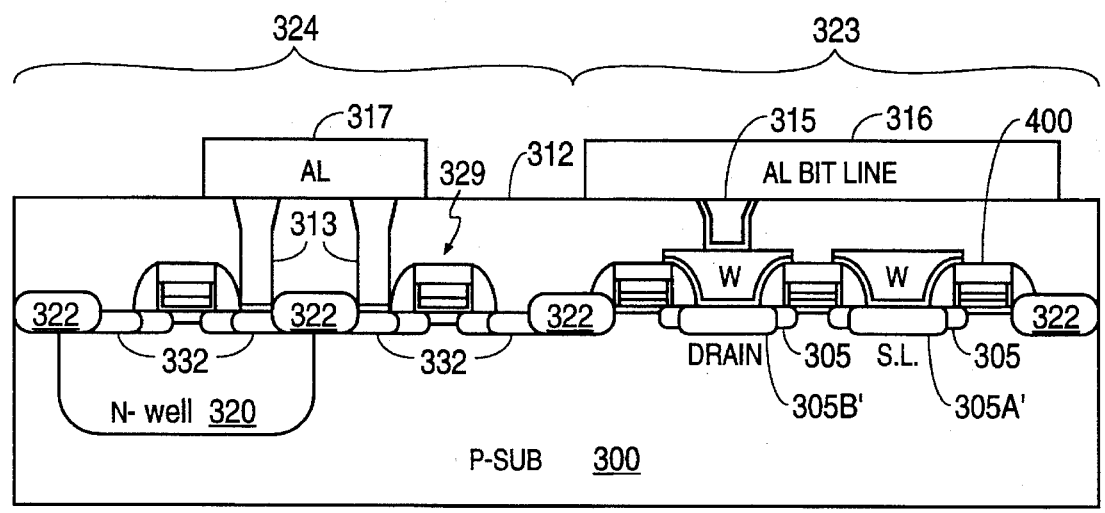

Then, referring to FIG. 3V, a conductive layer of approximately 5000Å is deposited over array 323 and periphery 324, thereby filling in openings 336 and 333, and then etched back to the surface of insulating layer 312 to form plugs 313 and 315.

After forming plugs 313 and 315, a metal layer is formed over insulating layer 312 and plugs 313, 315. Finally, a photoresist mask (not shown) is formed and patterned over this metal layer such that an etch through this metal layer to insulating layer 312 forms metal lines 316 (the bit line) and 317.

To increase memory cell density, the conventional diffused source region, i.e. source region 305A, is narrowed in relation to drain region 305B, thereby increasing source line resistance. This undesirable resistance deteriorates both the programming speed capability and the erasing uniformity (assuming a source erase) of the memory cells. To reduce this source line resistance, the prior art provides source line contacts, typically every 16 bits.

The present invention eliminates the need for these frequent source line contacts. Specifically, the source line for array 323 is plug 310A (see FIG. 3V). Plug 310A, because of its metal composition, significantly reduces source line resistance, thereby eliminating the need for frequent source line contacts which further increases the cell effeciency. Moreover, reducing source line resistance improves the cell programming speed and increases cell current. Thus, in accordance with one embodiment of the present invention, self-aligned source lines are provided by plugs 310A. Moreover, as noted in reference to FIG. 4A, the active regions 403 are straight strips. In the prior art, the active regions of a cell are typically a T-type configuration which requires a margin to ensure proper spacing in the cell. Active regions 403 eliminate the need for this margin, and thus further minimize cell area.

Furthermore, the self-formed contact to drain region 305B', comprising plugs 310B and 315, also provides significant advantages over prior art cell fabrication methods. In conventional methods of forming a drain contact, an etch is performed from the top insulating layer through multiple layers to the substrate. This prior art method may result in contact misalignment, and may even breach the memory cell isolation, thereby causing associated leakage problems. To solve this problem, prior art fabrication techniques must include additional spacing between memory cells to provide a reasonable margin to account for such contact misalignment.

In contrast, the present invention provides a self-formed contact which requires etching only through the top insulating layer to the drain pad, i.e., plug 310B. In this manner, misalignment of the contact opening, if it occurs, will virtually never result in breach of the memory cell isolation. Moreover, in the embodiment shown in FIGS. 3O and 3V, the portion of plug 310B contacting drain region 305B is smaller than the top portion of plug 310B. Making the top portion of plug 310B larger further minimizes the criticality of positioning plug 315 on plug 310B. Thus, the present invention ensures memory cell integrity and continued top performance. As a result, significant scaling constraints of the prior art are virtually eliminated, thereby allowing ultrahigh density of memory cells.

Figure 4A:
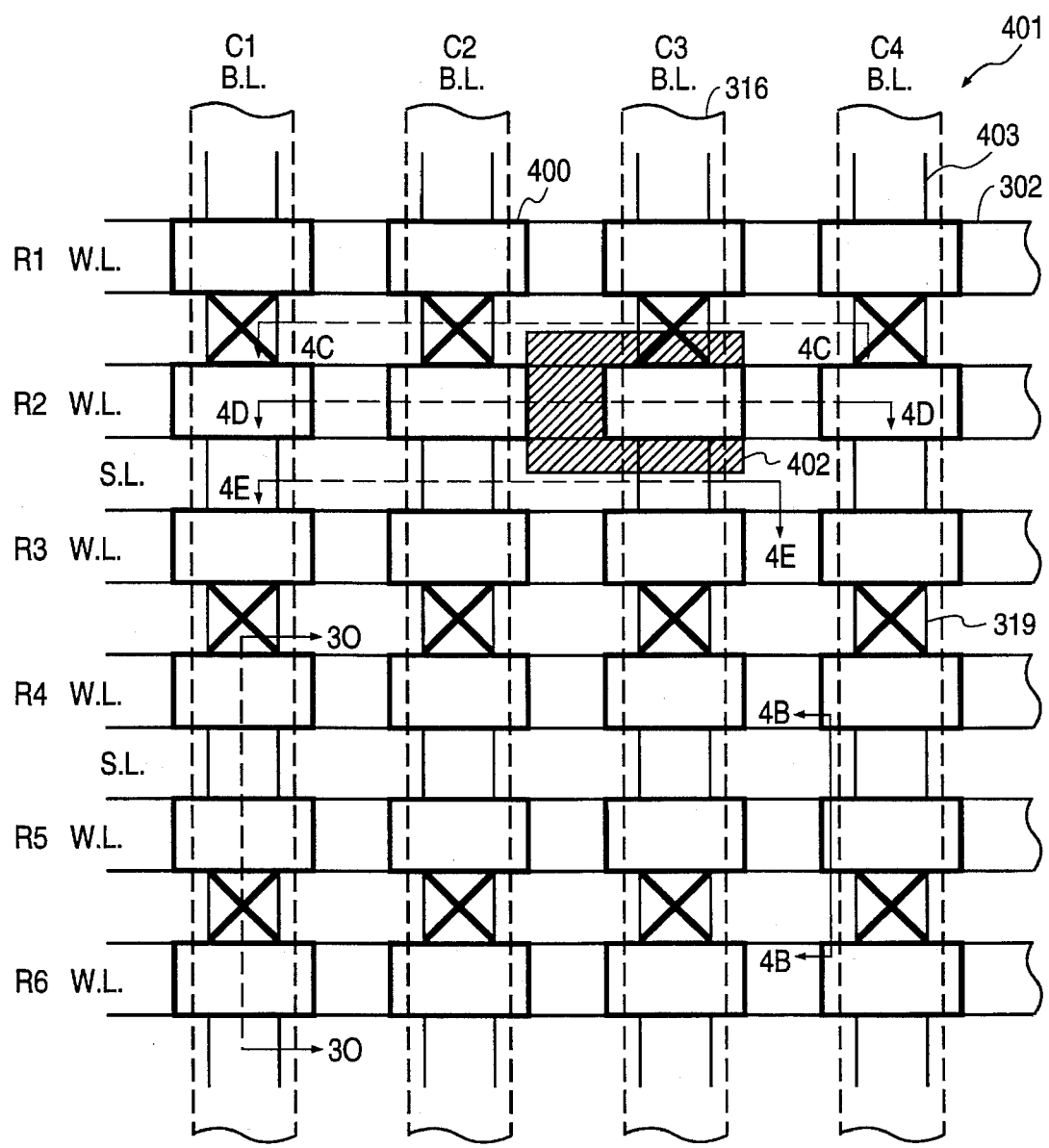
FIG. 4A illustrates an array of memory cells in accordance with the present invention.

A top plan view of a portion of a memory cell array 401 in accordance with the present invention is shown in FIG. 4A. In array 401, memory cells 400 are positioned in rows R and columns C. Each row, for example row R1, further includes a word line WL which is formed from polysilicon layer 302 in memory cells 400. Each column, for example column C1, further includes a bit line BL which is formed from metal line 316 (FIG. 3O). Self-formed contacts 319 are indicated by the crossed sections in array 401. Source lines SL, i.e., plugs 310B, are formed between selected word lines WL, for example rows R2 and R3. As previously mentioned, the active regions 403 are straight strips in this embodiment of the present invention. Finally, box 402 indicates the typical boundaries of a memory cell 400 which determines the size (i.e. area in square microns) of each cell.

Figure 4B:
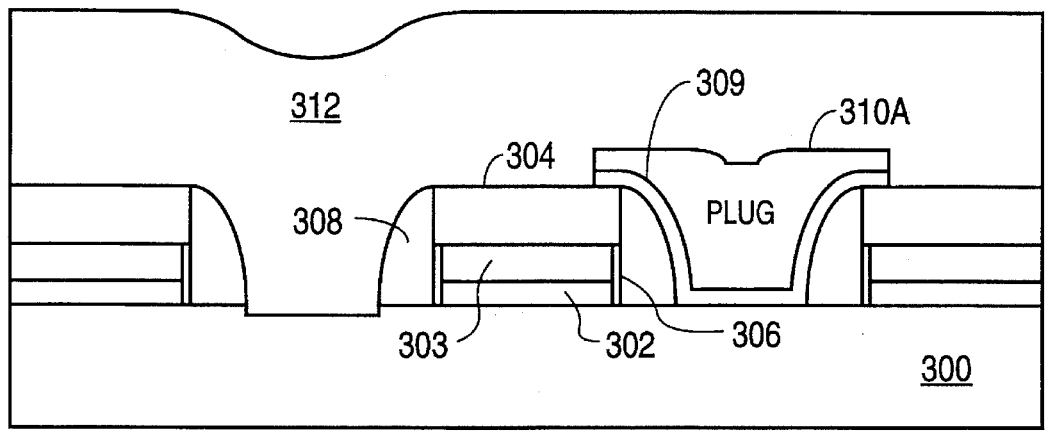
FIGS. 4B–4E show various cross-sections of the array illustrated in FIG. 4A.
Figure 4C:
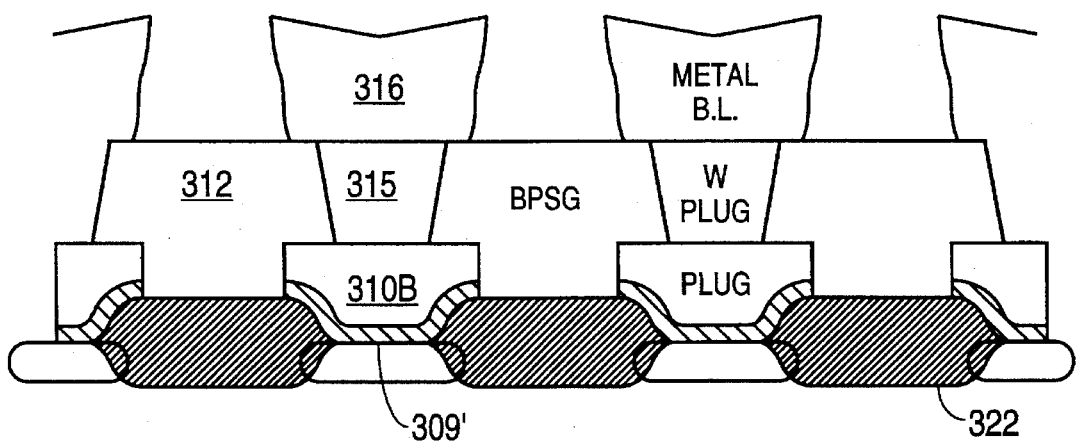
Figure 4D:
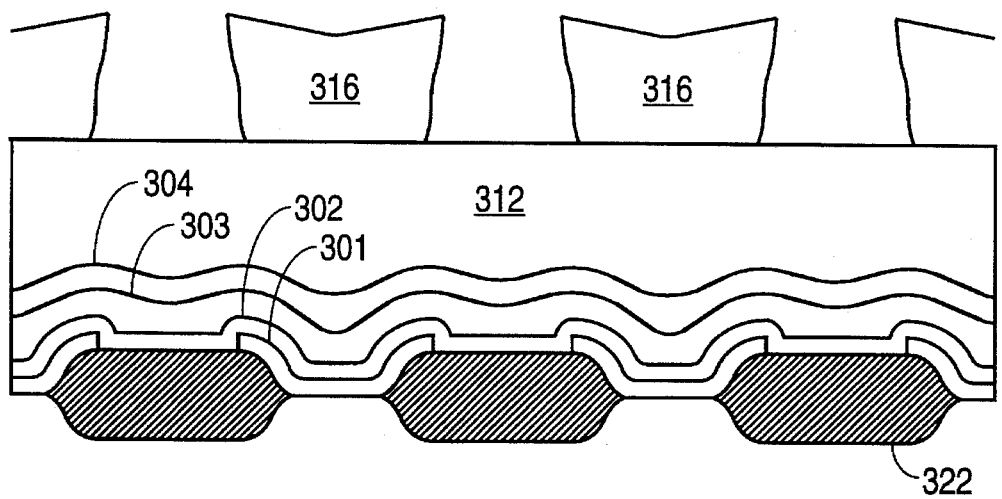
Figure 4E:
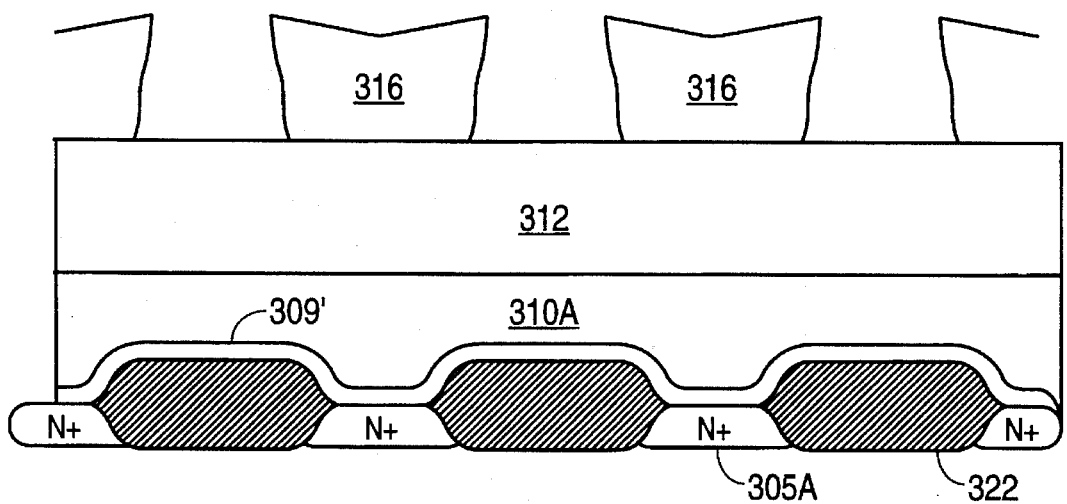

Various cross-sections of array 401 are illustrated in FIGS. 4B–4E. Specifically, FIG. 4B shows a cross-section of array 401 between bit lines BL (metal lines 316); FIG. 4C shows a cross-section of array 401 between word lines WL (polysilicon layer 302); FIG. 4D shows a cross-section of the array along a word line WL (302); and FIG. 4E shows a cross-section of array 401 along a source line SL (plug 310A overlying source region 305A). Reference numerals on these figures correspond to those numerals in FIGS. 3A–3V and therefore are not described in detail. Note that FIGS. 3O and 3V illustrate a cross-section of array 401 along a bit line (316), and include a portion of transistors in periphery 324 which is not shown in FIG. 4A.

Figure 5:
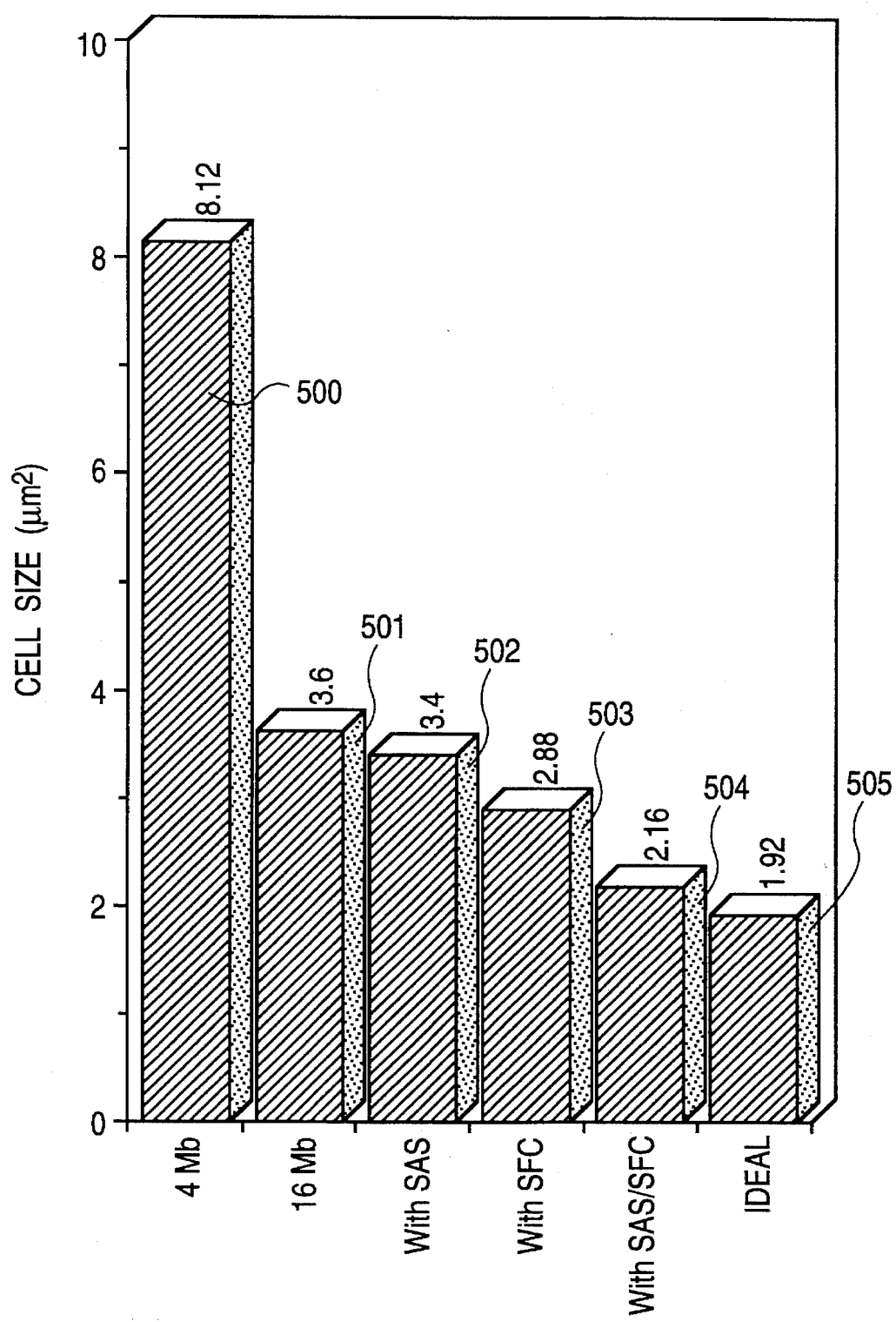
FIG. 5 illustrates graphically memory cell size with technology improvements, including a self-formed contact and a self-aligned source in accordance with the present invention.

The present invention, by providing a self-formed contact and a self-aligned source, has significant size advantages over the prior art. FIG. 5 illustrates graphically the size (in square microns) of a typical EPROM cell (y-axis) versus various technology improvements (x-axis), including technology improvements realized using the present invention. Column 500 shows that a typical EPROM cell in a 4 Mb chip has a corresponding area of 8.12 square microns by 0.8 µm fabrication technology. Referring to column 501, a typical EPROM cell in a 16 Mb chip has a corresponding area of 3.6 square microns by 0.6 µm fabrication technology.

In accordance with the present invention in 0.6 µm fabrication technology, a self-formed contact in the array for contact with a bit line decreases the typical area of a memory cell, for example an EPROM cell, to 3.4 square microns as shown in column 502. In further accordance with the invention and illustrated by column 503, a self-aligned source line substantially reduces the area of a typical EPROM cell to 2.88 square microns. Column 504 illustrates the dramatic size reduction achieved where the array, in accordance with the present invention, has both a self-formed contact and a self-aligned source line. Specifically, the area of an EPROM cell is reduced to 2.16 square microns. Column 505 shows an ideal case in which the cell size is defined solely by lithographic limits, i.e. the polysilicon pitch (typically 0.6 µm) and the metal pitch (typically 0.8 µm). For 0.6 µm technology, the lithographic limits provide a cell size of 1.2 µm (2× 0.6 µm) by 1.6 µm (2×0.8 µm), i.e 1.92 µm².

The present invention, in addition to reducing array size, provides improved cell performance characteristics. Specifically, the programming speed is improved because of the reduction of source line resistance. Similarly, the cell current is also increased because of the reduced source line resistance, thereby improving the read capability. Finally, the present invention, by eliminating misalignment of the source line, also improves the erase dispersion in the cell.

The preceding description is meant to be illustrative only and not limiting. For example, array 401 (FIG. 4A) may comprise electrically programmable read only memory (EPROM) cells, electrically erasable programmable read only memory (EEPROM) cells, flash EPROM cells or any other memory cell configuration. Accordingly, other embodiments not described above may be within the scope of the invention as defined by the appended claims.

I claim:

1. A structure for a memory array comprising:
    a plurality of memory cells on a substrate, each of said memory cells having a gate overlying said substrate, a source region formed in said substrate, and a drain region formed in said substrate, wherein each drain region is shared by a pair of adjacent memory cells and each source region is shared by a pair of adjacent memory cells;
    a plurality of sidewall spacers, each of said sidewall spacers having a first side adjacent to one of said gates and a second side self-aligned at a fixed offset from said one of said gates;
    a first conductive plug in electrical contact with one of said drain regions and filling a space having boundaries partly defined by the sidewall spacers of adjacent memory cells; and
    a second conductive plug in contact with a plurality of said source regions and filling a space having boundaries defined by the sidewall spacers of adjacent memory cells, said second conductive plug forming a continuous source line.

2. The structure of claim 1, wherein said sidewall spacers are formed by anisotropically etching an unmasked region of an insulating layer.

3. The structure of claim 1, further comprising a glue/barrier layer formed on said substrate between adjacent sidewall spacers, said glue/barrier layer being between said first conductive plug and said substrate.

4. The structure of claim 3, further comprising a plurality of reoxidation layers, each reoxidation layer being formed between one of said gates of said memory cells and one of said plurality of sidewall spacers.

5. The structure of claim 1, further comprising:
    an insulating layer disposed over said memory cells and said first and second conductive plugs;
    a bit line formed on said insulating layer: and
    a contact formed through said insulating layer said contact connecting said bit line to said first conductive plug.

6. The structure of claim 5, further comprising a barrier metal layer formed between said conductive plug and said contact.

7. The structure of claim 1, wherein said first and second conductive plugs comprise metal plugs.

8. The structure of claim 7, wherein said first and second conductive plugs comprise tungsten plugs.

9. The structure of claim 7, further comprising a glue/barrier layer disposed between said metal plugs and said substrate.

10. The structure of claim 1, wherein:
    said first conductive plug has a first wall and a second wall defined by said sidewall spacers and a third wall and a fourth wall extending from said first wall to said second wall;
    said first wall is substantially parallel to said second wall; and
    said third wall is substantially parallel to said fourth wall.

11. The structure of claim 1, wherein each gate further comprises:
    a control gate;
    a floating gate;
    a first insulating layer separating said control gate from said floating gate; and
    a second insulating layer separating said floating gate from said substrate.

12. A memory array comprising:
    a semiconductor substrate;
    a first word line overlying said substrate;
    a second word line overlying said substrate;
    a first sidewall spacer positioned between said first and second word lines, said first sidewall spacer having a first side adjacent to said first word line and a second side self-aligned at a fixed offset, from said first word line;
    a second sidewall spacer positioned between said first and second word lines, said second sidewall spacer having a first side adjacent to said second word line and a second side self-aligned at said fixed offset, from said second word line;

a plurality of source regions formed in an area of said substrate between said first and second word lines; and a continuous conductive plug filling a space having boundaries partly defined by said second sides of said first and second sidewall spacers, said continuous conductive plug being in electrical contact with said plurality of source regions and forming a source line of said memory array.

13. The memory array of claim 12, further comprising:

a third word line overlying said substrate;

a third sidewall spacer positioned between said second and third word lines and adjacent to said third word line;

a fourth sidewall spacer positioned between said second and third word lines and adjacent to said second word line;

a plurality of drain regions formed in an area of said substrate between said second and third word lines; and a plurality of isolated conductive plugs, each of said isolated conductive plugs being in electrical contact with a corresponding one of said plurality of drain regions and filling a space having boundaries partly defined by said third and fourth sidewall spacers and partly defined by a mask.

14. The memory array of claim 13, further comprising:

an insulating layer disposed over said memory cells and said plurality of isolated conductive plugs;

a bit line formed on said insulating layer; and a contact formed through said insulating layer to connect said bit line to one of said plurality of isolated conductive plugs.

15. The memory array of claim 13, further comprising a plurality of floating gates between said second word line and said substrate, each of said floating gates overlying an area of said substrate that is between a corresponding one of said source regions and a corresponding one of said drain regions.

16. The memory array of claim 12, further comprising a glue/barrier layer formed on a portion said area of said substrate between said first and second word lines.

17. The memory of claim 13, wherein said continuous conductive plug and said isolated conductive plugs have the same composition and thickness.

18. The structure of claim 1, wherein said first and second conductive plugs have the same composition and thickness.

* * * * *